US011415959B2

(12) United States Patent
Yen et al.

(10) Patent No.: US 11,415,959 B2
(45) Date of Patent: Aug. 16, 2022

(54) METHOD FOR GENERATING MOVEMENT PATH OF TOOL

(71) Applicant: MIRLE AUTOMATION CORPORATION, Hsinchu (TW)

(72) Inventors: Hao-Wei Yen, Hsinchu (TW); Ming-Chih Hsiao, Hsinchu (TW); Chen-Yi Lin, Hsinchu (TW)

(73) Assignee: MIRLE AUTOMATION CORPORATION, Hsinchu (TW)

( * ) Notice: Subject to any disclaimer, the term of this patent is extended or adjusted under 35 U.S.C. 154(b) by 0 days.

(21) Appl. No.: 17/326,624

(22) Filed: May 21, 2021

(65) Prior Publication Data
US 2022/0035333 A1 Feb. 3, 2022

Related U.S. Application Data

(60) Provisional application No. 63/057,581, filed on Jul. 28, 2020.

(30) Foreign Application Priority Data

Jan. 4, 2021 (TW) .................................. 110100025

(51) Int. Cl.
*B23Q 15/24* (2006.01)
*G05B 19/41* (2006.01)
(Continued)

(52) U.S. Cl.
CPC ........... *G05B 19/402* (2013.01); *B23Q 15/24* (2013.01); *G05B 19/4097* (2013.01); *G05B 19/41* (2013.01); *G06F 30/20* (2020.01)

(58) Field of Classification Search
None
See application file for complete search history.

(56) References Cited

U.S. PATENT DOCUMENTS 6,763,284 B2 7/2004 Watanabe et al.
7,076,346 B2 7/2006 Sturges et al.
(Continued)

FOREIGN PATENT DOCUMENTS

CN 1991305 B 8/2010
TW 201022871 A1 6/2010
(Continued)

*Primary Examiner* — Ryan A Jarrett
(74) *Attorney, Agent, or Firm* — Li & Cai Intellectual Property (USA) Office

(57) ABSTRACT

A method for generating a movement path of a tool configured to utilize a virtual path to generate a correct path that fits an allowable error is provided. The method includes a receiving step implemented by receiving the virtual path and a precision data; an auxiliary point establishing step implemented by adding a plurality of auxiliary points in a plurality of arc sections; a moving and detecting step implemented by controlling the tool to sequentially move to a plurality of predetermined points and the auxiliary points according to the virtual path; and a calculating step implemented by amending the predetermined points or the auxiliary points in the virtual path if a difference between a real-time position coordinate and corresponding one of the predetermined points or the auxiliary points is greater than the allowable error to generate the correct path.

8 Claims, 7 Drawing Sheets

(51) Int. Cl.
*G05B 19/402* (2006.01)
*G06F 30/20* (2020.01)
*G05B 19/4097* (2006.01)

(56) References Cited

U.S. PATENT DOCUMENTS 7,810,698 B2 10/2010 Chung et al.
10,088,824 B2 * 10/2018 Otomo .................. G05B 19/18

FOREIGN PATENT DOCUMENTS

| | | |
|---|---|---|
| TW | 201120596 A1 | 6/2011 |
| TW | M568752 U | 10/2018 |
| TW | 201902605 A | 1/2019 |
| WO | 2020034420 A1 | 2/2020 |

* cited by examiner (A) → S3: The moving and detecting step is implemented by controlling a driver to allow the tool to sequentially move to each of the predetermined points and each of the auxiliary points in the space according to the virtual path and controlling a detector to detect three reflectors disposed on the tool when the tool is located at each of the predetermined points and each of the auxiliary points so as to generate a real-time position coordinate and two auxiliary point coordinates S4: The calculating step is implemented by comparing each of a plurality of real-time position coordinates with a predetermined point coordinate that corresponds to a corresponding one of the predetermined points to calculate a deviating value of an X-axis, a deviating value of a Y-axis, and a deviating value of a Z-axis between each of the real-time position coordinates and the predetermined point coordinate and calculating, when the tool moves to each of the predetermined points, a deflecting value of the X-axis, a deflecting value of the Y-axis, and a deflecting value of the Z-axis of a coordinate system of the tool that are respectively compared with an X-axis, a Y-axis, and a Z-axis of a coordinate system of the virtual path S5: The correct path establishing step is implemented by copying the virtual path to establish an original path, and amending the predetermined point coordinate and the two auxiliary point coordinates having the deviating value or the deflecting value greater than the allowable error in the original path to amend the original path into the correct path

FIG. 3-2

METHOD FOR GENERATING MOVEMENT PATH OF TOOL

CROSS-REFERENCE TO RELATED PATENT APPLICATION

This application claims the benefit of priority to Taiwan Patent Application No. 110100025, filed on Jan. 4, 2021. The entire content of the above identified application is incorporated herein by reference.

This application claims priority to the U.S. Provisional Patent Application Ser. No. 63/057,581 filed on Jul. 28, 2020, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a method for generating a movement path of a tool, and more particularly to a method for generating a movement path of a tool that moves on an arc surface or a curved surface in a space.

BACKGROUND OF THE DISCLOSURE

Generally, when a user wants to control a tool to perform a processing operation to an object to be processed in a three-dimensional space, the user usually plans a movement path of the tool in the three-dimensional space in advance through a path planning software. After the user finishes planning the movement path through the path planning software, the user manually controls the tool to gradually move in a space without the object to be processed according to the movement path, and every time after the tool moves to a certain position, the user manually controls a related detecting device to detect a current position of the tool to obtain and record a current coordinate of the tool.

Finally, the user must utilize a related statistical software to compare a coordinate of each certain position of the movement path and a coordinate of the tool every time after the tool moves, so as to determine whether a difference between the above two coordinates fits an allowable error. If the difference does not fit the allowable error, the user should manually amend the corresponding coordinate in the movement path. The above-mentioned method wastes considerable manpower and time.

SUMMARY OF THE DISCLOSURE

In response to the above-referenced technical inadequacies, the present disclosure provides a method for generating a movement path of a tool primarily configured to modify a time and manpower wasting issue of a conventional path correcting method that is manually implemented.

In one aspect, the present disclosure provides a method for generating a movement path of a tool configured to utilize a virtual path to generate a correct path that fits an allowable error. The virtual path is planned through a path planning software when the tool is to be moved in a space, the virtual path includes a plurality of predetermined points, and the method for generating the movement path of the tool is configured to be implemented by a processing device. The method includes a receiving step, an auxiliary point establishing step, a moving and detecting step, a calculating step, and a correct path establishing step. The receiving step is implemented by receiving the virtual path and a precision data. The auxiliary point establishing step is implemented by defining the virtual path into at least one non-arc section and at least one arc section and defining the at least one arc section into M number of auxiliary sections according to the precision data to correspondingly generate M−1 number of auxiliary points. A quantity of the auxiliary points included by the at least one arc section is greater than a quantity of the predetermined points included by the at least one arc section. The moving and detecting step is implemented by controlling a driver to allow the tool to sequentially move to each of the predetermined points and each of the auxiliary points in the space according to the virtual path and controlling a detector to detect three reflectors disposed on the tool when the tool is located at each of the predetermined points and each of the auxiliary points so as to generate a real-time position coordinate and two auxiliary point coordinates. The real-time position coordinate and each of the auxiliary point coordinates include an X-axis coordinate value, a Y-axis coordinate value, and a Z-axis coordinate value. The calculating step is implemented by comparing each of a plurality of real-time position coordinates with a predetermined point coordinate that corresponds to a corresponding one of the predetermined points to calculate a deviating value of an X-axis, a deviating value of a Y-axis, and a deviating value of a Z-axis between each of the real-time position coordinates and the predetermined point coordinate and calculating, when the tool moves to each of the predetermined points, a deflecting value of the X-axis, a deflecting value of the Y-axis, and a deflecting value of the Z-axis of a coordinate system of the tool that are respectively compared with an X-axis, a Y-axis, and a Z-axis of a coordinate system of the virtual path. Each of the real-time position coordinates and corresponding two of the plurality of auxiliary point coordinates jointly define the X-axis, the Y-axis, and the Z-axis of the coordinate system of the tool. The correct path establishing step is implemented by copying the virtual path to establishing an original path, and amending the predetermined point coordinate and the auxiliary point coordinate having the deviating value or the deflecting value greater than the allowable error in the original path to amend the original path into the correct path.

Therefore, the method for generating the movement path of the tool of the present disclosure can automatically amend the virtual path and generate the correct path, so that the tool can more accurately move in the space. When implementing the method for generating the movement path of the tool, no manpower is required, thereby effectively improving the time and manpower wasting issue of the conventional path correcting method that is manually implemented. These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which:

FIG. 3-1 FIG. 3-2 are a flowchart of the method for generating the movement path of the tool according to one embodiment of the present disclosure;

FIG. 5-1 and FIG. 5-2 are a flowchart of the method for generating the movement path of the tool according to one embodiment of the present disclosure.

DETAILED DESCRIPTION OF THE EXEMPLARY EMBODIMENTS

Figure 1:
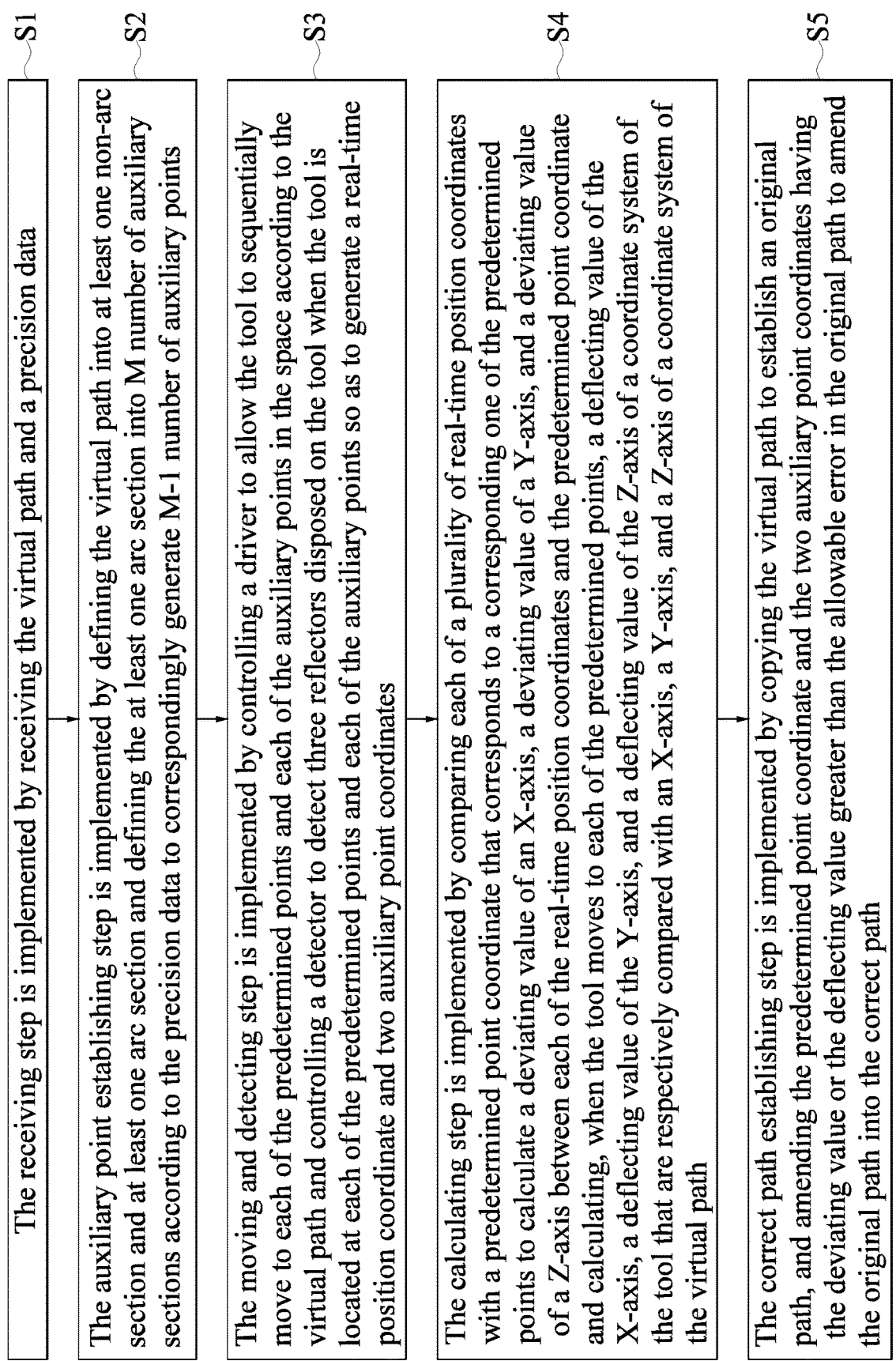
FIG. 1 is a flowchart of a method for generating a movement path of a tool according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1, FIG. 1 is a flowchart of a method for generating a movement path of a tool according to an embodiment of the present disclosure. The method for generating a movement path of a tool is configured to utilize a virtual path to generate a correct path that fits an allowable error. The virtual path is planned by a user through a path planning software when the user wants to move the tool in a space, and the virtual path includes a plurality of predetermined points. The method for generating the movement path of the tool can be implemented by a processing device, and the processing device can be various types of microprocessors (e.g., a central processing unit), computers, or servers, but the present disclosure is not limited thereto.

For example, if the user wants to control a knife (i.e., the above-mentioned tool) to perform a cutting operation to a curved surface of a vane, the user can utilize the path planning software to plan a processing path (i.e., the above-mentioned virtual path) of the cutting operation in advance that is performed by the knife to the vane. The path planning software can be implemented by a computer, and the user can operate the path planning software through a display device (e.g., one of screens of various types) and an input device (e.g., various types of mouses and keyboards) that are connected to the computer to plan the processing path (i.e., the above-mentioned virtual path). In a practical application, when the computer implements the path planning software, the user can see a three-dimensional simulation diagram of the vane to be processed in the path planning software, and when the user plans the processing path, the processing path can be directly drawn in the three-dimensional simulation diagram of the vane.

When the user utilizes the path planning software to finish planning the processing path (i.e., the above-mentioned virtual path), the user can see the three-dimensional simulation diagram of the vane that is required to be processed and the processing path (i.e., the above-mentioned virtual path) at the same time through the display device, the processing path (i.e., the above-mentioned virtual path) shown by the display device can be formed by a plurality of predetermined points and a plurality of line segments, and adjacent two of the predetermined points are connected by one of the line segments.

According to the above, generally, after the user utilizing the path planning software to finish planning the movement path, the user directly utilizes the path planning software to output a path file, and then the user inputs the path file to a processing apparatus that includes the knife. After the processing apparatus receives the path file, the processing apparatus allows the knife to process the curved surface of the vane along the processing path (i.e., the above-mentioned virtual path) according to the path file. However, since the processing path planned by utilizing the path planning software and an actual movement path of the knife may not be entirely the same due to various reasons, the final product may not fit the requirement of technical personnel. Therefore, the method for generating the movement path of the tool of the present discourse is configured to amend the processing path (i.e., the above-mentioned virtual path), so that the actual movement path of the knife better fits the virtual path, and the final product fits the requirement of the technical personnel.

It should be noted that in the above description, the user utilizes the path planning software to plan a cutting path of the knife to the vane, but the present disclosure is not limited thereto. In a practical application, the user can utilize the path planning software to plan a movement path for a different tool performing a different operation to a different object according to practical requirements. For example, the user can utilize the path planning software to plan a soldering path for a soldering tool performing a soldering operation to a particular position of a curved surface of a sheet metal member. Or, the user can utilize the path planning software to plan a path for a surface measuring tool measuring a surface of a curved-surface member. Or, the user can utilize the path planning software to plan a path for a lacquer thickness measuring tool measuring a surface of the curved-surface member. Or, the user can utilize the path planning software to plan a path for a coating tool coating a surface of the curved-surface member.

The method for generating the movement path of the tool of the present disclosure includes a receiving step S1, an auxiliary point establishing step S2, a moving and detecting step S3, a calculating step S4, and a correct path establishing step 5.

The receiving step S1 is implemented by receiving the virtual path and a precision data.

The auxiliary point establishing step S2 is implemented by defining the virtual path into at least one non-arc section and at least one arc section and defining the at least one arc section into M number of auxiliary sections according to the precision data to correspondingly generate M−1 number of auxiliary points. A quantity of the auxiliary points included by the at least one arc section is greater than a quantity of the predetermined points included by the at least one arc section.

The moving and detecting step S3 is implemented by controlling a driver to allow the tool to sequentially move to each of the predetermined points and each of the auxiliary points in the space according to the virtual path and controlling a detector to detect three reflectors disposed on the tool when the tool is located at each of the predetermined points and each of the auxiliary points so as to generate a real-time position coordinate and two auxiliary point coordinates. The real-time position coordinate and each of the auxiliary point coordinates include an X-axis coordinate value, a Y-axis coordinate value, and a Z-axis coordinate value.

The calculating step S4 is implemented by comparing each of a plurality of real-time position coordinates with a predetermined point coordinate that corresponds to a corresponding one of the predetermined points to calculate a deviating value of an X-axis, a deviating value of a Y-axis, and a deviating value of a Z-axis between each of the real-time position coordinates and the predetermined point coordinate and calculating, when the tool moves to each of the predetermined points, a deflecting value of the X-axis, a deflecting value of the Y-axis, and a deflecting value of the Z-axis of a coordinate system of the tool that are respectively compared with an X-axis, a Y-axis, and a Z-axis of a coordinate system of the virtual path. Each of the real-time position coordinates and corresponding two of the plurality of auxiliary point coordinates jointly define the X-axis, the Y-axis, and the Z-axis of the coordinate system of the tool.

The correct path establishing step S5 is implemented by copying the virtual path to establish an original path, and amending the predetermined point coordinate and the two auxiliary point coordinates having the deviating value or the deflecting value greater than the allowable error in the original path to amend the original path into the correct path.

In a practical application, the processing device that implements the path planning software can be used to implement the method for generating the movement path of the tool, but the present disclosure is not limited thereto. In other embodiments, the processing device that implements the path planning software can be different from the processing device that implements the method for generating the movement path of the tool, and the processing device that implements the method for generating the movement path of the tool can obtain the virtual path generated by the path planning software in a wired manner or in a wireless manner. For example, the processing device that implements the path planning software can be a computer that is independent from the processing apparatus, and the processing device that implements the method for generating the movement path of the tool can be a processing device in the processing apparatus. The computer can transmit the virtual path generated thereby to the processing device of the processing apparatus, and the processing apparatus can include the tool, the detector, and related components for transferring the tool.

Figure 2:
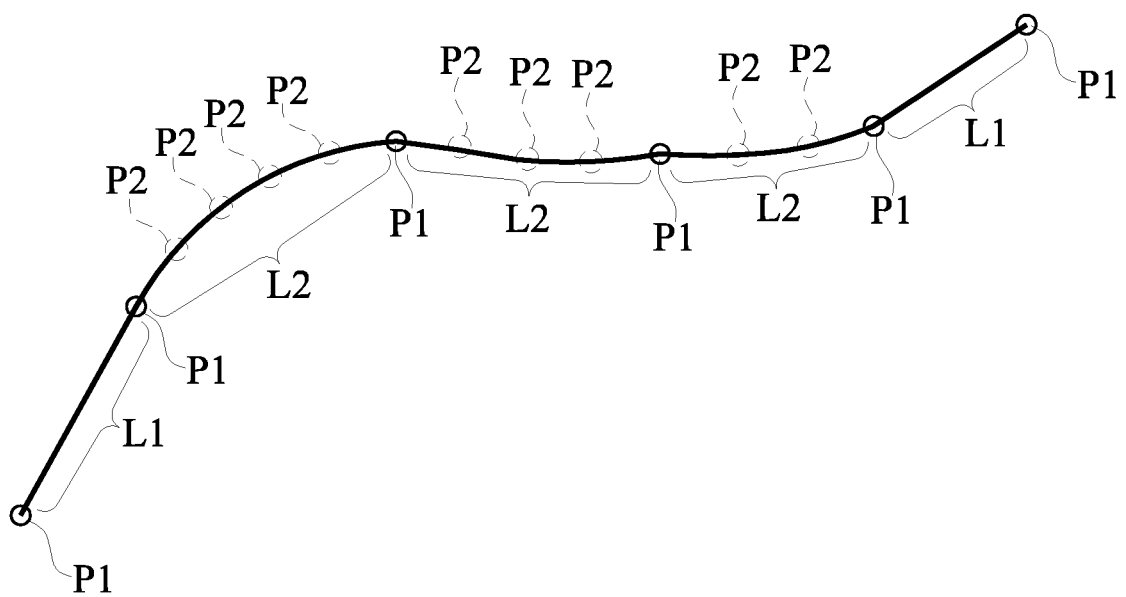
FIG. 2 is a schematic view of the movement path, a plurality of predetermined points, and a plurality of auxiliary points.
Figures 1, 3:
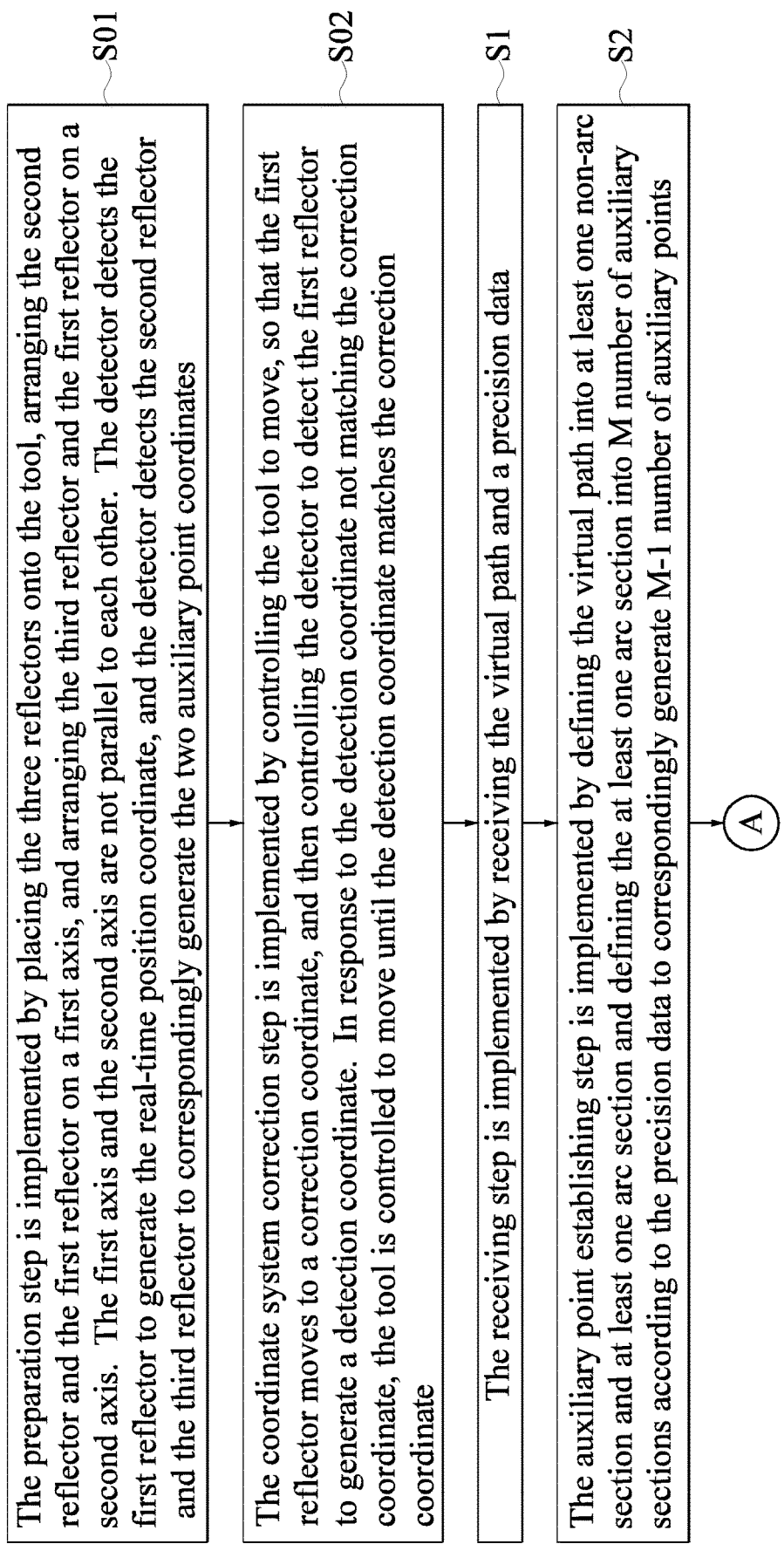

Referring to FIG. 2, FIG. 2 is a schematic view of a movement path, a plurality of predetermined points, and a plurality of auxiliary points. For example, if the virtual path includes six predetermined points P1, and in the auxiliary point establishing step S2, the processing device determines that the virtual path includes two non-arc sections and three arc-sections, the processing device adds a plurality of auxiliary points P2 in each of the arc-sections. A difference on the X-axis coordinate, a difference on the Y-axis coordinate, and a difference on the Z-axis coordinate of two auxiliary point coordinates respectively corresponding to adjacent two of the auxiliary points are respectively less than a difference on the X-axis coordinate, a difference on the Y-axis coordinate, and a difference on the Z-axis of two predetermined point coordinates corresponding to adjacent two of the predetermined points of one of the arc sections. In other words, a sectional path L1 between adjacent two of the predetermined points P1 includes the plurality of the auxiliary points P2, and the auxiliary points P2 are configured to define the sectional path L1 between the adjacent two of the predetermined points P1 into a plurality of auxiliary sections L2.

In the auxiliary point establishing step S2, the processing device can calculate the predetermined point coordinates included by the virtual path, so as to utilize the adjacent two of the predetermined point coordinates to calculate a radian of the sectional path connecting the adjacent two of the predetermined points. In response to the radian being greater than a predetermined radian, the sectional path is determined as one of the arc sections, and the one of the arc sections is defined into M number of auxiliary sections according to the precision data. In contrast, in response to the radian being less than the predetermined radian, the sectional path is determined as one of the non-arc sections. Afterwards, the processing device does not add any auxiliary point to the one of the non-arc sections. In other words, when the processing device determines that the sectional path between the two of the predetermined points is the arc-section, the pressing device adds the auxiliary points in the sectional path, but when the sectional path is the non-arc section, the processing device selectively adds or does not add the auxiliary points in the non-arc section according to a design by the user.

Referring to FIG. 2, in a preferred embodiment, the processing device can decide the quantity of the auxiliary points added in each of the arc sections according to a radian of each of the arc sections. In other words, the quantity of the auxiliary points added in the arc section by the processing device is directly proportional to the radian of the arc section, and the greater the radian of the arc section is, the greater quantity of the auxiliary points that are added in the arc section is.

In a practical application, before implementing the receiving step, the processing device configured to implement the method for generating the movement path of the tool can implement an operation process, and the processing device can be connected to a display device. When the processing device implements the operation process, the processing device can control the display device to display an operation menu, and the user can input the precision data through an input device connected to the processing device. Or, the user can select the precision data in the operation menu through the input device. For example, the user can see a plurality of different tools that correspond to a plurality of different precision data in the operation menu, and when the user selects one of the different tools in the operation menu, the operation menu shows corresponding one of the precision data. The precision data can include a distance that the processing device controls the tool to move every time. Or, the precision data can include a minimum distance that the tool moves straight by. Naturally, in other embodiments, the user can utilize the input device to directly input the precision data according to practical requirements.

Figure 4:
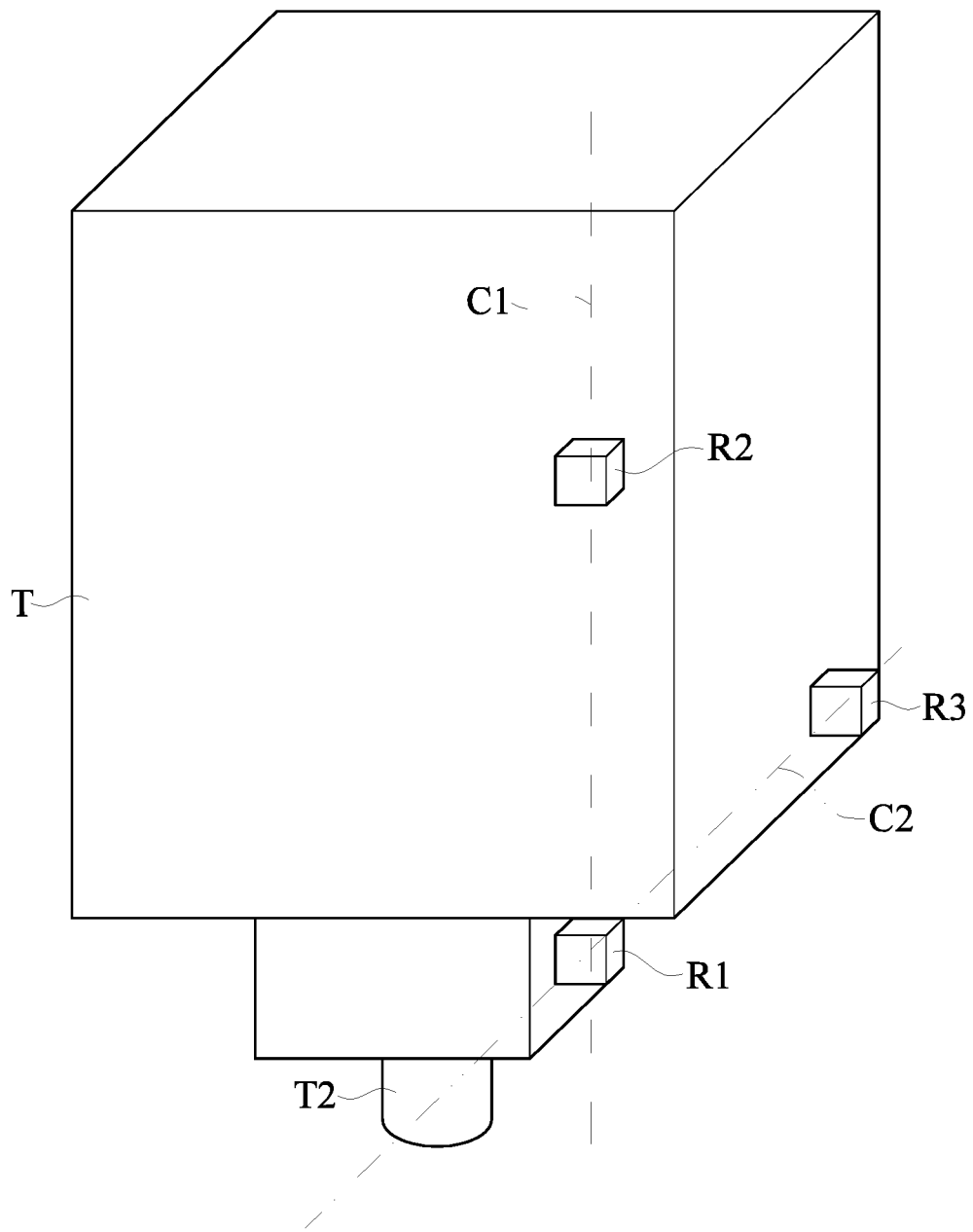
FIG. 4 is a schematic view of three reflectors disposed on the tool.

According to the above, more specifically, in a practical application, if the processing device controls the tool to directly move along one of the arc sections of the virtual path according to the virtual path, the actual movement path of the tool may be close to a straight line. Therefore, through the auxiliary point establishing step S2, each of the arc sections included by the virtual path is defined into the auxiliary sections in advance, so that each of the arc sections included by the virtual path is defined into the auxiliary sections each close to a straight line, and the tool sequentially moves along the non-arc sections and each of the auxiliary sections. Therefore, the actual movement path of the tool is closer to the virtual path. Referring to FIG. 3-1, FIG. 3-2, and FIG. 4, FIG. 3-1 FIG. 3-2 are a flowchart of a method for generating a movement path of a tool according to an embodiment of the present disclosure, and FIG. 4 is a schematic view of three reflectors disposed on the tool. The three reflectors are respectively defined as a first reflector R1, a second reflector R2, and a third reflector R3.

A difference between the present embodiment and the previous embodiment is as follows. Before the receiving step S1, the method can further include a preparation step S01 implemented by placing the three reflectors onto the tool T, arranging the second reflector R2 and the first reflector R1 on a first axis C1, and arranging the third reflector R3 and the first reflector R1 on a second axis C2. The first axis C1 and the second axis C2 are not parallel to each other. In the moving and detecting step S3, the detector detects the first reflector R1 to generate the real-time position coordinate, and the detector detects the second reflector R2 and the third reflector R3 to correspondingly generate the two auxiliary point coordinates. Preferably, the first axis C1 and the second axis C2 are perpendicular to each other. In a practical application, the first reflector R1 is disposed near an operation head T2 of the tool T. For example, the tool T can be a cutting knife member, and the operation head T2 is a cutting knife.

It should be noted that, in a practical application, the virtual path can be an actual movement path of the operation head of the tool, after the processing device detects the first reflector to generate the real-time position coordinate, the real-time position coordinate can be converted into an operation head coordinate through a position calculation, and the operation head coordinate is a coordinate of an actual position where the operation head is located. The position calculation can perform a calculation (e.g., addition, subtraction, multiplication, and division) to an X-axis coordinate value, a Y-axis coordinate value, and a Z-axis coordinate value of the real-time position coordinate. Or, the real-time position coordinate can be multiplied by a coordinate conversion matrix, and a specific calculation content of the position calculation can be designed according to the type of the tool and the structure, the dimension, and the disposed position of the first reflector and the operation head, but the present disclosure is not limited thereto.

Another difference between the present embodiment and the previous embodiment is as follows. Before the receiving step S1, the method can further include a coordinate system correction step SO2 implemented by controlling the tool to move, so that the first reflector moves to a correction coordinate, and then controlling the detector to detect the first reflector to generate a detection coordinate. In response to the detection coordinate not matching the correction coordinate, the tool is controlled to move until the detection coordinate matches the correction coordinate. Through the design of the coordinate system correction step S02, an origin of the virtual path can overlap with an origin of the coordinate system of the tool.

Another difference between the present embodiment and the previous embodiment is as follows. In the calculating step S4, the real-time position coordinate and the two auxiliary point coordinates are utilized to respectively calculate a first axis vector and a second axis vector of two of a plurality of axis directions in the coordinate system of the tool, the first axis vector and the second axis vector are utilized to calculate a third axis vector of the coordinate system of the tool, and the deflecting value of the first axis vector, the deflecting value of the second axis vector, and the deflecting value of the third axis vector respectively between the X-axis, the Y-axis, and the Z-axis of the coordinate system of the virtual path are calculated. The coordinate system of the virtual path can be defined in the coordinate system correction step SO2 by the user through the processing device.

Figures 1, 5:
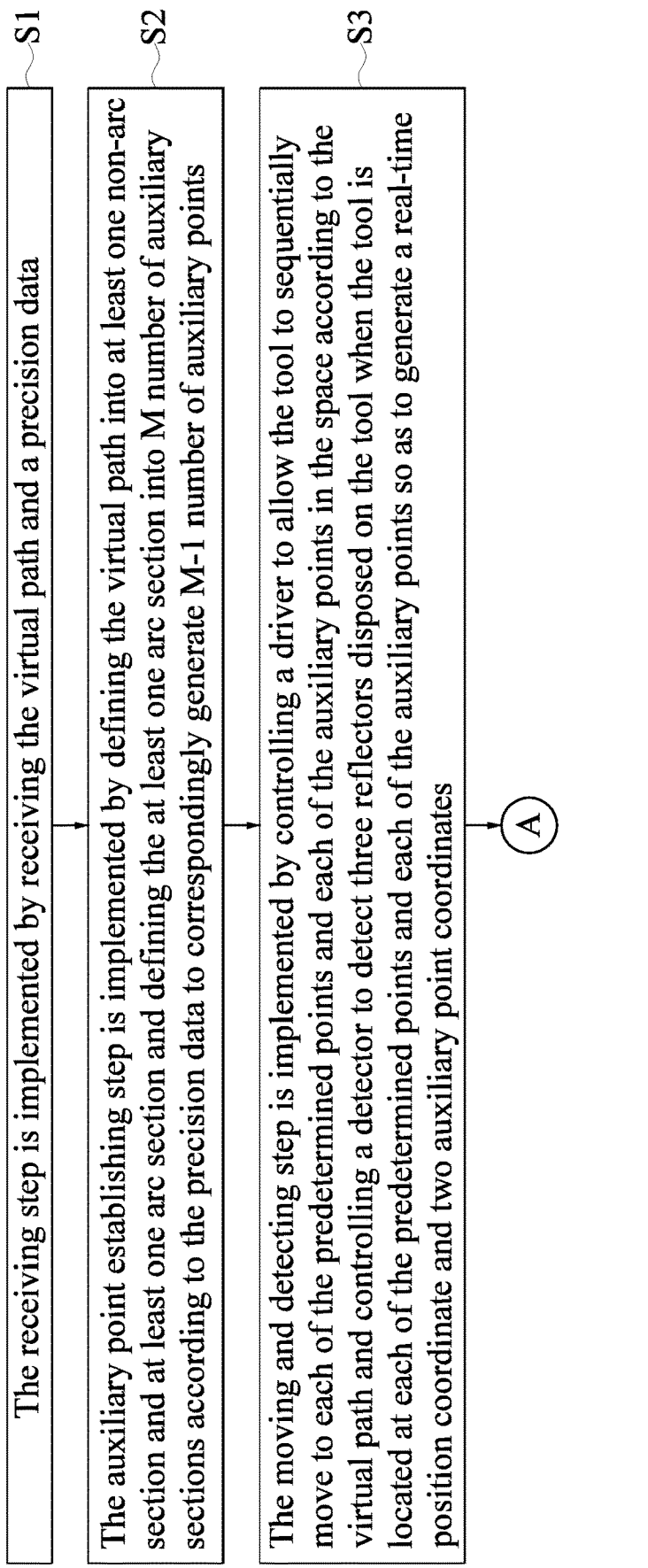
Figures 2, 5:
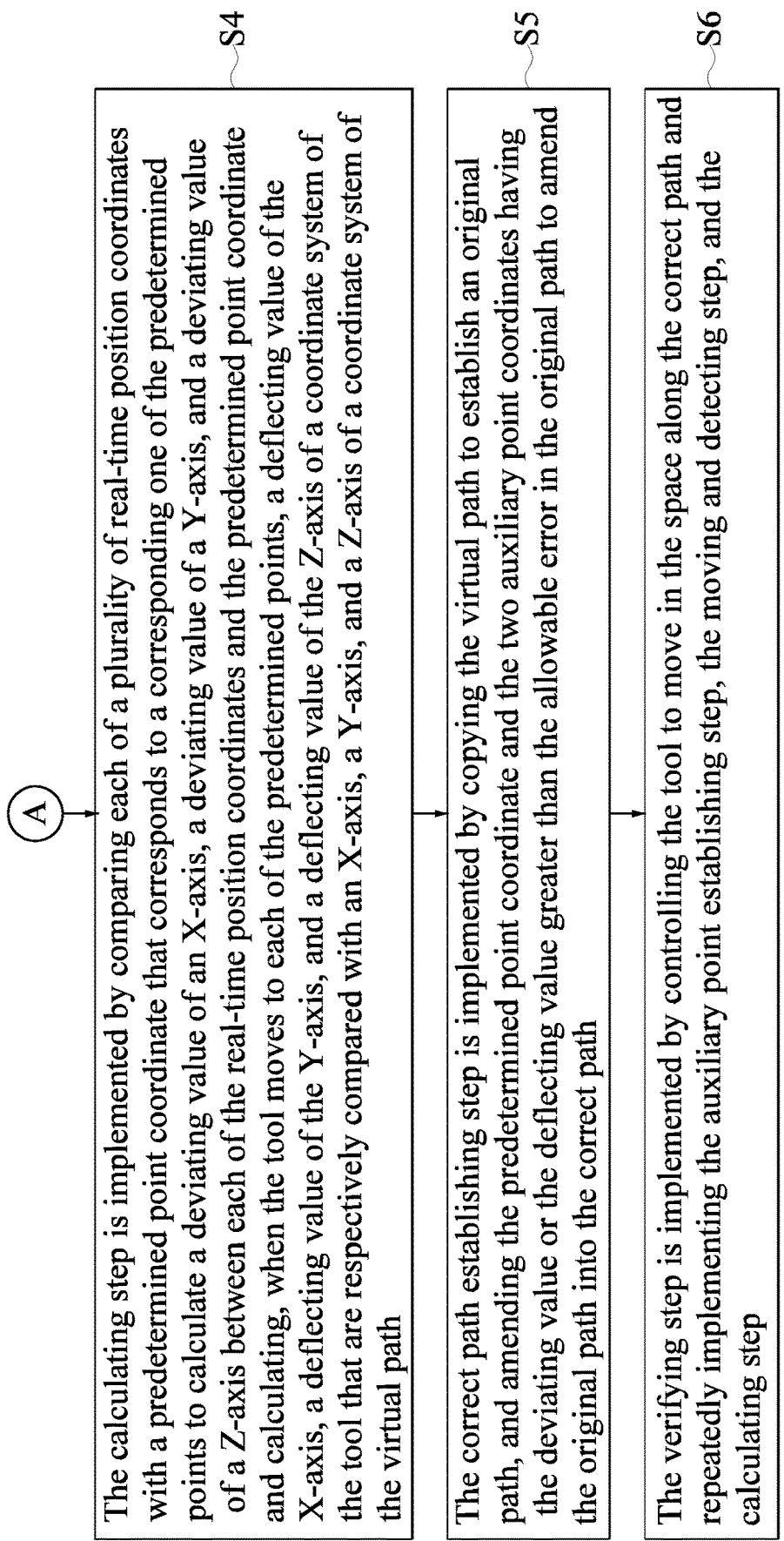

Referring to FIG. 5-1 and FIG. 5-2, FIG. 5-1 and FIG. 5-2 are a flowchart of a method for generating a movement path of a tool according to an embodiment of the present disclosure. The difference between the present embodiment and previous embodiments is as follows. After the correct path establishing step S5, the method further includes a verifying step S6 implemented by controlling the tool to move in the space along the correct path and repeatedly implementing the auxiliary point establishing step, the moving and detecting step, and the calculating step. After the verifying step S6 is implemented for at least one time, if the processing device determines the deviating values and the deflecting values of the real-time position coordinates are greater than the allowable error, the processing device controls an alert device to warn the user that a current tool or the related apparatus may have an error. The alert device can include at least one of a light emitting unit and a speaker unit, and the processing device can control the light emitting unit of the alert device to emit a beam of light having a specific color, or the processing device can control the speaker unit to produce a specific sound to warn the user that the current tool or the related apparatus may have an error (e.g., having a wrong precision data or a wrong tool).

Beneficial Effects of the Embodiments

In conclusion, through the design of the auxiliary point establishing step, the moving and detecting step, and the calculating step, the method for generating the movement path of the tool of the present disclosure can allow every movement of the tool to be close to a straight line. Therefore, the movement path of the tool in the space is closer to the virtual path, especially when the virtual path includes the arc sections, and when the tool moves along the correct path, the actual movement path of the tool better matches the virtual path planned by the user through the path planning software. In addition, when implementing the method for generating the movement path of the tool, no manpower is required, thereby improving a time and manpower wasting issue of a conventional path correcting method that is implemented manually.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A method for generating a movement path of a tool configured to utilize a virtual path to generate a correct path that fits an allowable error, wherein the virtual path is planned through a path planning software when the tool is to be moved in a space, the virtual path includes a plurality of predetermined points, and the method for generating the movement path of the tool is configured to be implemented by a processing device, the method comprising:
   a receiving step implemented by receiving the virtual path and a precision data;
   an auxiliary point establishing step implemented by defining the virtual path into at least one non-arc section and at least one arc section and defining the at least one arc section into M number of auxiliary sections according to the precision data to correspondingly generate M−1 number of auxiliary points, wherein a quantity of the auxiliary points included by the at least one arc section is greater than a quantity of the predetermined points included by the at least one arc section;
   a moving and detecting step implemented by controlling a driver to allow the tool to sequentially move to each of the predetermined points and each of the auxiliary points in the space according to the virtual path and controlling a detector to detect three reflectors disposed on the tool when the tool is located at each of the predetermined points and each of the auxiliary points so as to generate a real-time position coordinate and two auxiliary point coordinates, wherein the real-time position coordinate and each of the auxiliary point coordinates include an X-axis coordinate value, a Y-axis coordinate value, and a Z-axis coordinate value;
   a calculating step implemented by comparing each of a plurality of real-time position coordinates with a predetermined point coordinate that corresponds to a corresponding one of the predetermined points to calculate a deviating value of an X-axis, a deviating value of a Y-axis, and a deviating value of a Z-axis between each of the real-time position coordinates and the predetermined point coordinate and calculating, when the tool moves to each of the predetermined points, a deflecting value of the X-axis, a deflecting value of the Y-axis, and a deflecting value of the Z-axis of a coordinate system of the tool that are respectively compared with an X-axis, a Y-axis, and a Z-axis of a coordinate system of the virtual path, wherein each of the real-time position coordinates and corresponding two of the plurality of auxiliary point coordinates jointly define the X-axis, the Y-axis, and the Z-axis of the coordinate system of the tool; and
   a correct path establishing step implemented by copying the virtual path to establish an original path, and amending the predetermined point coordinate and the two auxiliary point coordinates having the deviating value or the deflecting value greater than the allowable error in the original path to amend the original path into the correct path.

2. The method according to claim 1, wherein the three reflectors are respectively defined as a first reflector, a second reflector, and a third reflector, wherein, before the receiving step, the method further includes a preparation step implemented by placing the three reflectors onto the tool, arranging the second reflector and the first reflector on a first axis, and arranging the third reflector and the first reflector on a second axis, wherein the first axis and the second axis are not parallel to each other, and wherein, in the moving and detecting step, the detector detects the first reflector to generate the real-time position coordinate, and the detector detects the second reflector and the third reflector to correspondingly generate the two auxiliary point coordinates.

3. The method according to claim 2, wherein the first axis and the second axis are perpendicular to each other.

4. The method according to claim 2, wherein, before the receiving step, the method further includes a coordinate system correction step implemented by controlling the tool to move, so that the first reflector is moved to a correction coordinate, and then controlling the detector to detect the first reflector to generate a detection coordinate, and in response to the detection coordinate not matching the correction coordinate, the tool is controlled to move until the detection coordinate matches the correction coordinate.

5. The method according to claim 4, wherein, in the calculating step, the real-time position coordinate and the two auxiliary point coordinates are utilized to respectively calculate a first axis vector and a second axis vector of two of a plurality of axis directions in the coordinate system of the tool, the first axis vector and the second axis vector are utilized to calculate a third axis vector of the coordinate system of the tool, and the deflecting value of the first axis vector, the deflecting value of the second axis vector, and the deflecting value of the third axis vector respectively between the X-axis, the Y-axis, and the Z-axis of the coordinate system of the virtual path are calculated.

6. The method according to claim 1, wherein a difference on the X-axis coordinate, a difference on the Y-axis coordinate, and a difference on the Z-axis coordinate of the two auxiliary point coordinates respectively corresponding to adjacent two of the auxiliary points are respectively less than a difference on the X-axis coordinate, a difference on the Y-axis coordinate, and a difference on the Z-axis of two predetermined point coordinates corresponding to adjacent two of the predetermined points of the at least one arc section.

7. The method according to claim 1, wherein, in the auxiliary point establishing step, the processing device calculates a plurality of predetermined point coordinates corresponding to the predetermined points included by the virtual path, so as to utilize adjacent two of the predetermined point coordinates to calculate a radian of a sectional path connecting adjacent two of the predetermined points, and wherein in response to the radian being greater than a predetermined radian, the sectional path is determined as the at least one arc section, and in response to the radian being less than the predetermined radian, the sectional path is determined as the at least one non-arc section.

8. The method according to claim 1, wherein, after the correct path establishing step, the method further includes a verifying step implemented by controlling the tool to move in the space along the correct path and repeatedly implementing the auxiliary point establishing step, the moving and detecting step, and the calculating step.

* * * * *